(12) United States Patent
Nakamori et al.

(10) Patent No.: US 7,602,871 B2
(45) Date of Patent: Oct. 13, 2009

(54) MOBILE COMMUNICATION TERMINAL

(75) Inventors: Takeshi Nakamori, Yokohama (JP);
Shinsuke Ogawa, Yokohama (JP);
Yousuke Iizuka, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 571 days.

(21) Appl. No.: 11/372,067

(22) Filed: Mar. 10, 2006

(65) Prior Publication Data
US 2006/0203854 A1    Sep. 14, 2006

(30) Foreign Application Priority Data
Mar. 14, 2005  (JP) .............................. 2005-071357

(51) Int. Cl.
*H04L 7/00*    (2006.01)
(52) U.S. Cl. ...................... 375/355; 375/362
(58) Field of Classification Search ................ 375/354, 375/355, 358, 362, 371
See application file for complete search history.

(56) References Cited

U.S. PATENT DOCUMENTS

| | | | |
|---|---|---|---|
| 3,163,715 A | * | 12/1964 | Teramura et al. .......... 178/23 R |
| 6,084,905 A | | 7/2000 | Ishifuji et al. |
| 6,337,651 B1 | | 1/2002 | Chiang |
| 6,359,579 B1 | | 3/2002 | Chiang |
| 6,421,353 B1 | | 7/2002 | Kim |
| 2001/0032322 A1 | | 10/2001 | Gau |
| 2003/0156671 A1 | * | 8/2003 | Lee et al. ..................... 375/355 |
| 2003/0206561 A1 | * | 11/2003 | Schmidl et al. ............. 370/522 |

FOREIGN PATENT DOCUMENTS

| | | |
|---|---|---|
| EP | 0 757 458 A2 | 2/1997 |
| JP | 2004-165929 | 6/2004 |
| TW | 431069 | 4/2001 |
| WO | WO 2004/059864 A1 | 7/2004 |

OTHER PUBLICATIONS

U.S. Appl. No. 11/371,102, filed Mar. 9, 2006, Nakamori, et al.

* cited by examiner

*Primary Examiner*—Chieh M. Fan
*Assistant Examiner*—Freshteh N Aghdam
(74) *Attorney, Agent, or Firm*—Oblon, Spivak, McClelland, Maier & Neustadt, L.L.P.

(57) ABSTRACT

Improve efficiency of sampling of an A/D converter while suppressing power consumption. A packet receiving section receives six packets included in one frame transmitted from a base station, a sample timing control section shifts sample timing of the A/D converter by a half clock between former three packets and latter three packets out of six packets included in one frame.

7 Claims, 13 Drawing Sheets

MOBILE COMMUNICATION TERMINAL

BACKGROUND OF THE INVENTION

1. Field of the Invention

The present invention relates to a mobile communication terminal having an A/D converter.

2. Related Background of the Invention

Generally, a mobile communication terminal such as a mobile telephone converts a packet (analog signals) received from a base station to digital signals through sampling by an A/D converter. Such a mobile communication terminal can obtain the best reception characteristic when sampling received analog signal at a position of the maximum amplitude.

A related art of the sampling in an A/D converter is disclosed, for example, in a patent document 1 (Japanese Patent Application Laid-open No. 2004-165929).

SUMMARY OF THE INVENTION

By the way, sample timing in an A/D converter of a mobile communication terminal may generate an error due to influence of a change in receiving environment or the like. The greater the error in the sample timing becomes, the more deteriorated the reception characteristic becomes.

Here, even when the error occurs in the sample timing, it is possible to increase a possibility of sampling analog signals near the position of the maximum amplitude by increasing the sample timing (increasing the sampling rate). That is, it is possible to keep the preferable reception characteristic by increasing the sample timing. However, the more sample timing increases, the more power consumption increases.

Therefore, in order to solve the problem described above, an object of the present invention is to provide a mobile communication terminal capable of improving efficiency of the sampling in the A/D converter while suppressing the power consumption.

A mobile communication terminal comprises: a receiving means for receiving packets; and a sample timing control means for controlling sample timing of an A/D converter to convert analog signals to digital signals, wherein the sample timing control means shifts, out of a plurality of packets included in one frame which is a communication unit at transmission control, the sample timing of the A/D converter for a half of packets by a half clock with respect to the sample timing of the A/D converter for the remaining half of packets.

According to the present invention, it is possible to shift the sample timing of the A/D converter by a half clock between a half of packets and the remaining half of packets out of a plurality of packets included in one frame. Due to this, when an error occurs in the sample timing, a transmission error can be suppressed in a half of packets sampled at the sample timing which is shifted by a half clock from the normal sample timing, while when no error occurs in the sample timing, the transmission error can be suppressed in a half of packets sampled at the normal sample timing. That is, the error in the sample timing can be averaged. Thus, with averaging the error in the sample timing, it becomes possible to improve efficiency of the sampling in the A/D converter while suppressing the power consumption.

In the mobile communication terminal of the present invention, the sample timing control means described above preferably shifts, out of a plurality of packets included in the frame, the sample timing of the A/D converter for a former packets by a half clock with respect to the sample timing of the A/D converter for the latter half of packets.

Alternatively, in the mobile communication terminal of the present invention, the sample timing control means preferably shifts the sample timing of the A/D converter for a plurality of packets included in the frame in such a manner that the sample timing is shifted by a half clock for every other packet.

The mobile communication terminal of the present invention comprises: a receiving means for receiving packets; a transmission error detection means for detecting transmission error in the packets received by the receiving means; and a sample timing control means for controlling sample timing of an A/D converter to convert analog signals to digital signals, wherein when transmission error is detected by the transmission error detection means in equal to or more than a half of a plurality of packets in one frame which is a communication unit in transmission control, the sample timing control means shifts the sample timing of the A/D converter for a plurality of packets included in the one frame by a half clock.

According to the present invention, when transmission error in equal to or more than a half of packets out of a plurality of packets included in one frame is detected, it is possible to shift the sample timing of the A/D converter for a plurality of packets included in the one frame by a half clock. Therefore, if error occurs in the sample timing when transmission error in equal to or more than a half of packets is detected, the transmission error of all packets included in one frame can be suppressed, it is made possible to highly improve the reception characteristic. Due to this, since the transmission error can be reduced without increasing the sample timing, it becomes possible to improve efficiency of the sampling in the A/D converter while suppressing the power consumption.

The mobile communication terminal of the present invention comprises: a receiving means for receiving packets; a transmission error detection means for detecting transmission error in the packets received by the receiving means; a retransmission request transmission means for transmitting a retransmission request requesting to retransmit a packet in which transmission error is detected by the transmission error detection means; and a sample timing control means for controlling sample timing of an A/D converter to convert analog signals to digital signals, wherein the retransmission request transmission means counts for each packet the number of times that a retransmission request has been transmitted, the sample timing control means, when a packet exists in which the number of times of the retransmission request counted is equal to or more than three among a plurality of packets in one frame which is a communication unit in transmission control, shifts the sample timing of the A/D converter for a plurality of packets included in the one frame by a half clock.

According to the present invention, when there exists a packet in which the number of times of the retransmission request is equal to or more than three, it is possible to shift the sample timing for a plurality of packets in one frame by a half clock. Therefore, if error occurs in the sample timing when there exists a packet in which the number of times of the retransmission request is equal to or more than three, the transmission error of all packets included in one frame can be reduced, it is possible to highly improve the reception characteristic. Due to this, since the transmission error can be reduced without increasing the sample timing, it becomes possible to improve efficiency of the sampling in the A/D converter while suppressing the power consumption.

According to the mobile communication terminal of the present invention, it is possible to improve efficiency of the sampling in the A/D converter while suppressing the power consumption.

DESCRIPTION OF THE PREFERRED EMBODIMENTS

A mobile communication terminal according to the present invention will be described accompanying drawings as follows.

A First Embodiment

First, a first embodiment of the present invention will be described. A cellular phone in this embodiment has high speed wireless communication function, for example, through HSDPA (high speed downlink packet access), and realizes high speed wireless communication through increasing usage efficiency of frequency by using the high rate error correction code and/or multi-valued modulation such as 16QAM (Quadrature Amplitude Modulation), or 64QAM.

Figure 1:
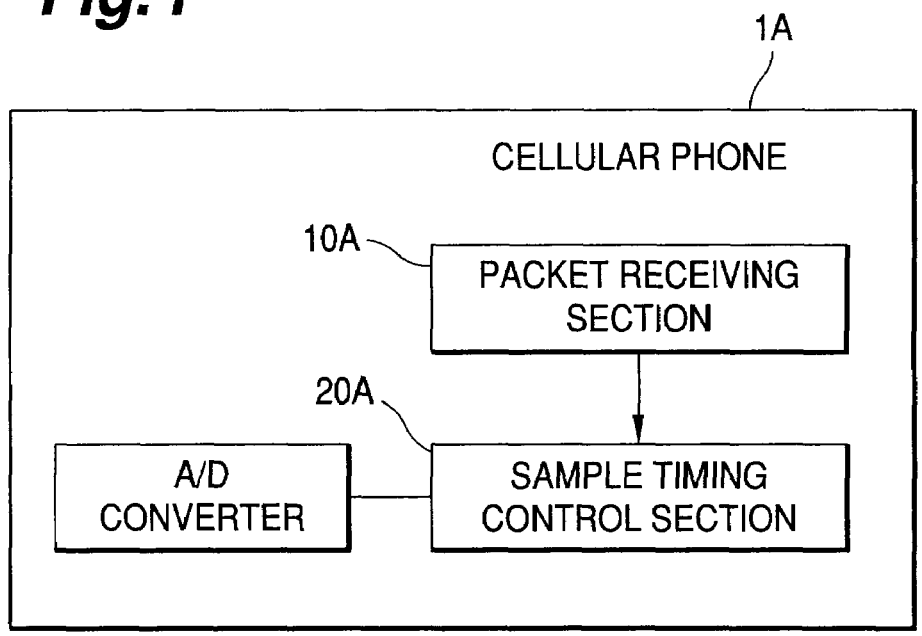
FIG. 1 is a block diagram showing functional configuration of a cellular phone in a first embodiment.

FIG. 1 is an example of block diagram showing functional configuration of a cellular phone 1A in a first embodiment As shown in FIG. 1, the cellular phone 1A has a packet receiving section 10A and a sample timing control section 20A.

The packet receiving section 10A receives packets (analog signals) transmitted from a base station.

The sample timing control section 20A controls shifting of the sample timing of the A/D converter for the first half packets by a half clock with respect to the sample timing of the A/D converter for the latter half packets out of a plurality of packets included in one frame. Incidentally, the A/D converter is a known AD converting unit which coverts analog signals to digital signals.

Figure 2:
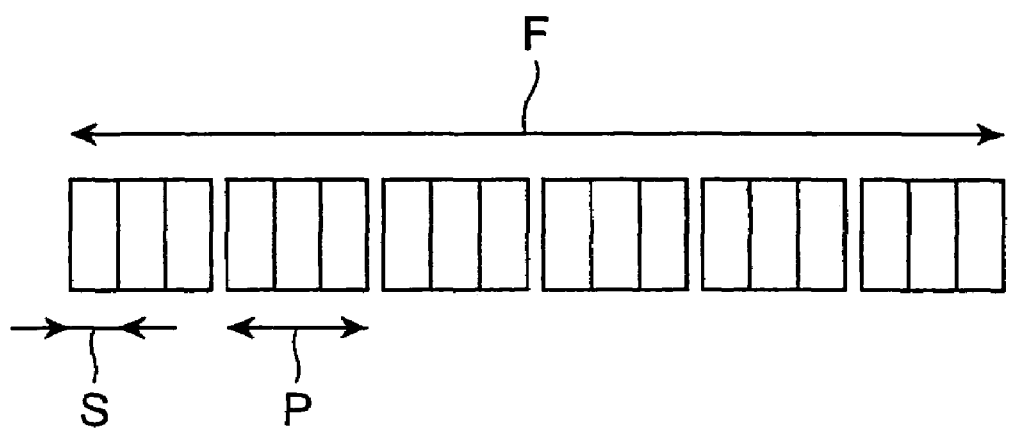
FIG. 2 is a diagram for introduction to communication unit in each embodiment.

Here, referring to FIG. 2, communication unit in this embodiment is described. As shown in FIG. 2, in this embodiment, a minimum communication unit is assumed to be one slot S, three slots S are assumed to be one packet P, and six packets P are assumed to be one frame F. Further, transmission error is detected for each one packet unit, and transmission control is performed for each one frame unit.

Figure 3:
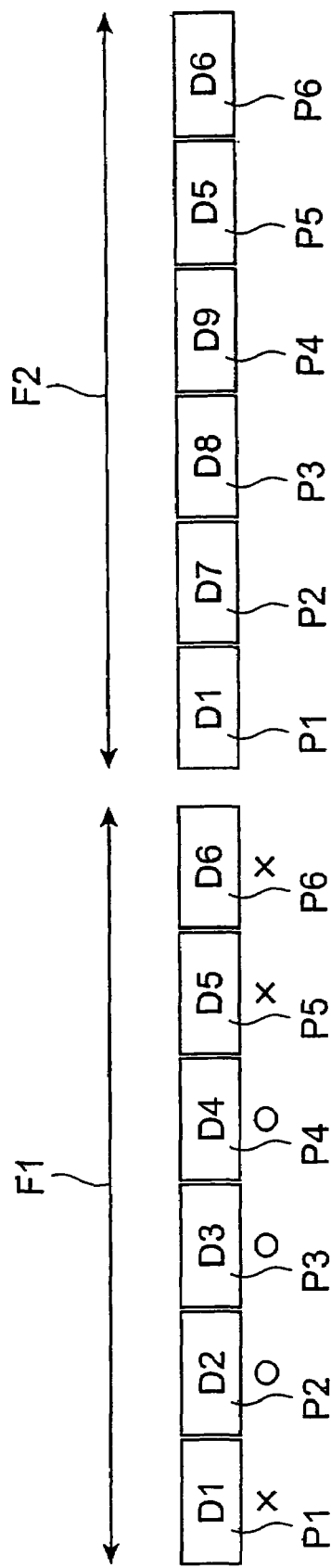
FIG. 3 is an illustration for introduction to transmission error detection and transmission control in each embodiment.

Referring to FIG. 3, transmission error detection and transmission control in this embodiment are described. As shown in FIG. 3, data transmitted from the base station to the cellular phone 1A are grouped per frame F1, F2. First, the cellular phone 1A receives six packets P1 to P6 included in the first frame F1 from the base station. Data D1 to D6 are stored in the six packets P1 to P6 respectively. Next, the cellular phone 1A detects transmission error in the first fame F1 per units P1 to P6. Next, the cellular phone 1A transmits to the base station a retransmission request requesting to retransmit the packet in which transmission error is detected. In the example of FIG. 3, transmission errors are detected in the three packets P1, P5, and P6 (x marks shown in FIG. 3), so that the retransmission request for these three packets is transmitted to the base station. Next, the cellular phone 1A receives six packets P1 to P6 included in the second frame F2 from the base station. Data D1, D7 to D9, D5, and D6 are stored in these six packets P1 to P6 respectively. Concretely described, the data D1, D5, and D6 which have been stored in the packets P1, P5, and P6 of the first frame F1 are stored as-is in the three packets P1, P5, and P6 among the six packets P1 to P6 included in the second frame F2, while the new data D7 to D9 are stored in the other packets P2 to P4. That is, the date stored in the corresponding packet included in the immediately preceding frame is continuously stored as-is in the packet in which transmission error is detected, while new data is stored in the packet in which no transmission error is detected. Thus, transmission error is detected per one packet unit, and transmission control is performed per one frame unit.

Figure 4:
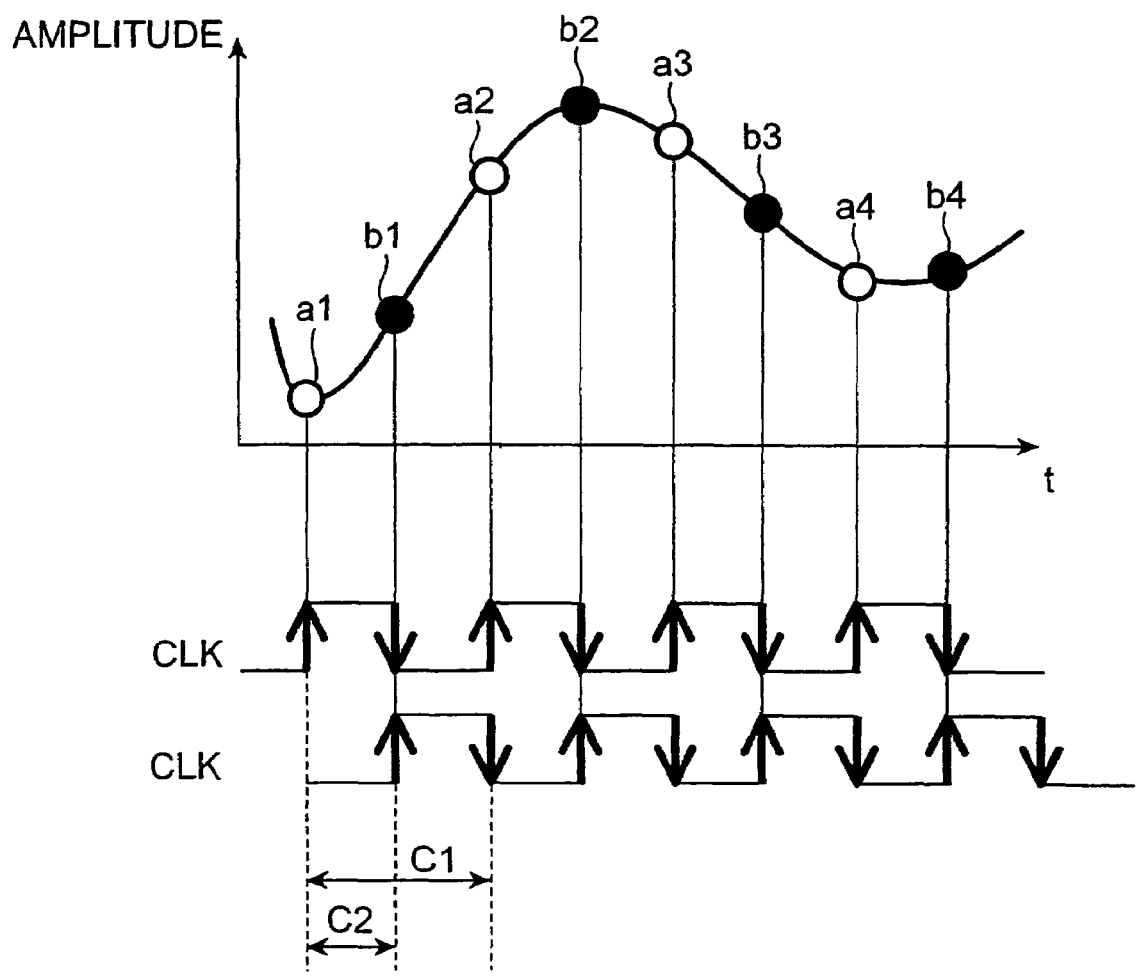
FIG. 4 is an illustration for introduction to sample timing in an A/D converter.

Next, referring to FIG. 4, the sample timing of the A/D converter of this embodiment is described. A horizontal axis and a vertical axis shown in FIG. 4 indicate time [t] and amplitude of analog signal respectively. The normal sample timing is shown by four points a1 to a4, in which the signal is sampled at a rising edge of a clock CLK. While, sample timing which is shifted from sample timing a1 to a4 by a half clock is shown by four points b1 to b4, in which the signal is sampled at a falling edge of the clock CLK. Adding these sample timing a1 to a4 and b1 to b4, total sample timing become 8 points. In addition, an interval C1 between the sample timing a1 and the sample timing a2 is a sampling period, that is, one clock, an interval C2 between the sample timing a1 and the sample timing b1 is a half of sampling period, that is, a half clock.

In the example shown in FIG. 4, when sampling at the normal sample timing a1 to a4, error occurs in the sample timing thereby the sample point near the maximum amplitude position fails to be obtained. Therefore, in this case, the reception characteristic is deteriorated. While when sampling at the sample timing b1 to b4 which is shifted by a half clock from the sample timing a1 to a4, the error is eliminated, and the sample timing b2 almost captures the maximum amplitude position. Therefore, in this case, the best reception characteristic can be obtained. Thus, when error occurs in the sample timing, shifting the sample timing by a half clock allows improvement in the reception characteristic.

Here, the reason for shifting the sample timing by a half clock is that it is possible to set the sample timing before shifting as the most distant timing from the sample timing after shifting. That is, by setting the sample timing in which the correlation between before and after shifting becomes minimum, it becomes possible to make the reception characteristic after shifting preferable, even when the reception characteristic before shifting is of poor quality. Therefore, shifting the sample timing by a half clock allows improvement in reception characteristic without changing the number of the samples. In other words, it is possible to improve efficiency of the sampling while suppressing the power consumption.

Further, in this embodiment, since the transmission data is transmitted from the base station to the cellular phone per one frame unit, deviation does not occur in principle in the transmission timing of each packet included in one frame. Therefore, when error occurs in the sample timing, by shifting the sample timing in each of the packets included in one frame in such a manner that the sample timing for the latter three packets is shifted by a half clock from the former three packets, error in the sample timing can be eliminated for the latter three packets the sample timing of which is shifted by a half clock. In this way, it is possible to prevent the situation in which transmission error occurs in all packets included in one frame.

On the other hand, when no error occurs in the sample timing, if the sample timing is shifted by a half clock between the former three packets and the latter three packets, error occurs in the sample timing for the latter three packets which are shifted by a half clock, and transmission error is likely to occur. However, when transmission error occurs, it becomes a subject of retransmission, so that it is possible to reduce occurrence of transmission error at the retransmission due to retransmission gain.

Therefore, by shifting the sample timing by a half clock between the latter three packets and the former three packets, errors in the sample timing can be averaged, and accordingly it is possible to improve the efficiency of the sampling.

Figure 5:
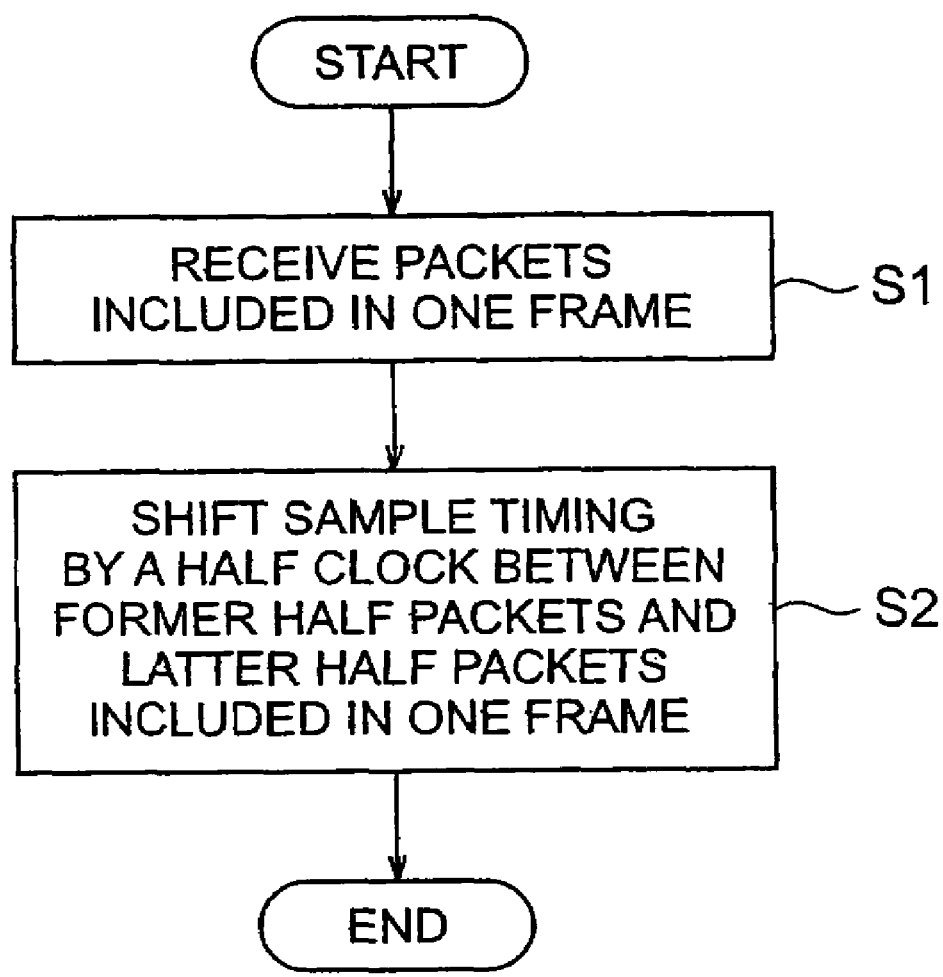
FIG. 5 is a flow chart for introduction to sample timing control process in a cellular phone of the first embodiment.
Figure 6:
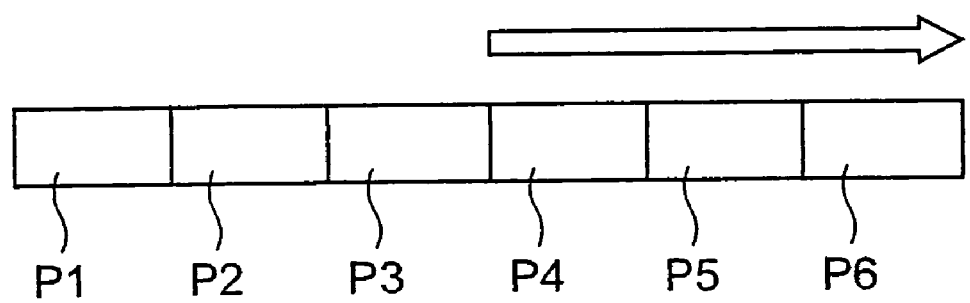
FIG. 6 is a schematic diagram for introduction to sample timing control process in a cellular phone of the first embodiment.

Next, referring to FIGS. 5 and 6, the sampling control process in the cellular phone 1A of the first embodiment will be described.

First, the packet receiving section 10A of the cellular phone 1A receives six packets included in one frame transmitted from the base station (step S1).

Next, the sample timing control section 20A shifts the sample timing by a half clock between the latter three packets and the former three packets in the A/D converter (step S2). Concretely described, as shown in FIG. 6, the sample timing control section 20A shifts the sample timing in the latter three packets P4 to P6 among the six packets P1 to P6 included one frame by a half clock.

Thus, in the first embodiment, when error occurs in the sample timing, it is possible to suppress transmission error for three packets which are sampled by the sample timing shifted from the normal sample timing by a half clock; while when no error occurs in the sample timing, it is possible to suppress transmission error for three packets which are sampled by the normal sample timing. That is, the error in sample timing can be averaged. Thus, by averaging the error in sample timing, it is possible to reduce the transmission error without increasing sample timing, so that it is possible to improve the efficiency of the sampling in the A/D converter while suppressing the power consumption.

A Second Embodiment

Next, a second embodiment of the present invention will be described. The different point of the cellular phone in the second embodiment from the cellular phone in the first embodiment is that the cellular phone in the first embodiment shifts the sample timing in each of the latter three packets and the sample timing in each of the former three packets included in one frame by a half clock; in contrast to this, the cellular phone in the second embodiment shifts the sample timing of each packet included in one frame by a half clock in every other packet. Other points are similar to the first embodiment, so that the different point from the first embodiment will be described hereinafter.

Figure 7:
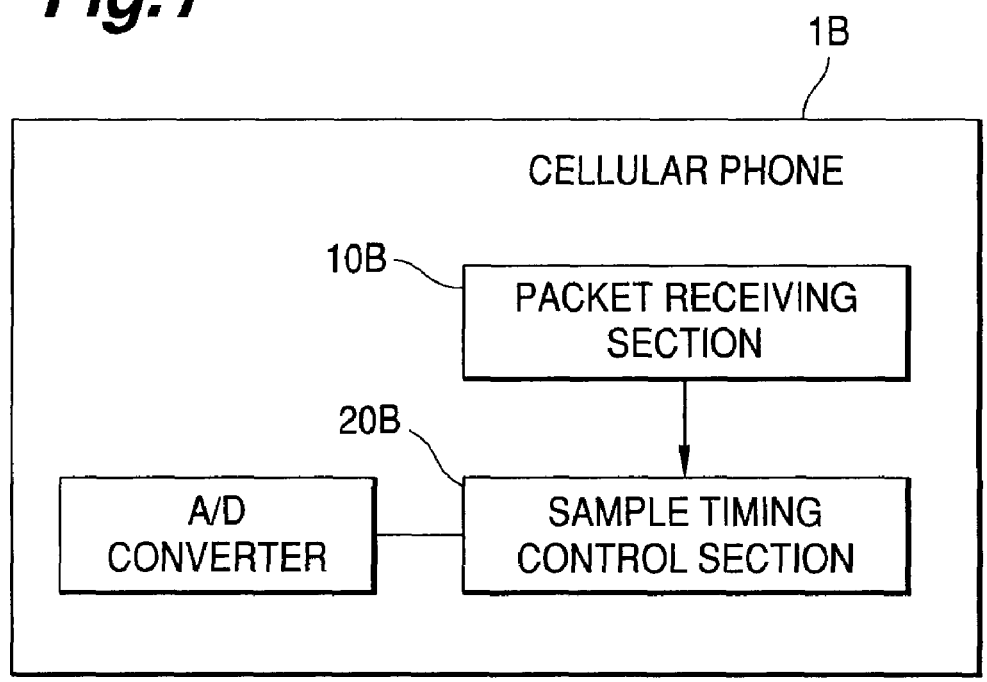
FIG. 7 is a block diagram showing functional configuration of a cellular phone in a second embodiment.

First, referring to FIG. 7, a functional configuration of a cellular phone 1B in the second embodiment will be described. As shown in FIG. 7, the cellular phone 1B in the second embodiment has a packet receiving section 10B and a sample timing control section 20B. The packet receiving section 10B is similar to the packet receiving section 10A in the first embodiment, so that its description is omitted.

The sample timing control section 20B controls shifting of the sample timing of the A/D converter in every other packet by a half clock, when sampling a plurality of packets included in one frame at intervals of one packet in turn.

Figure 8:
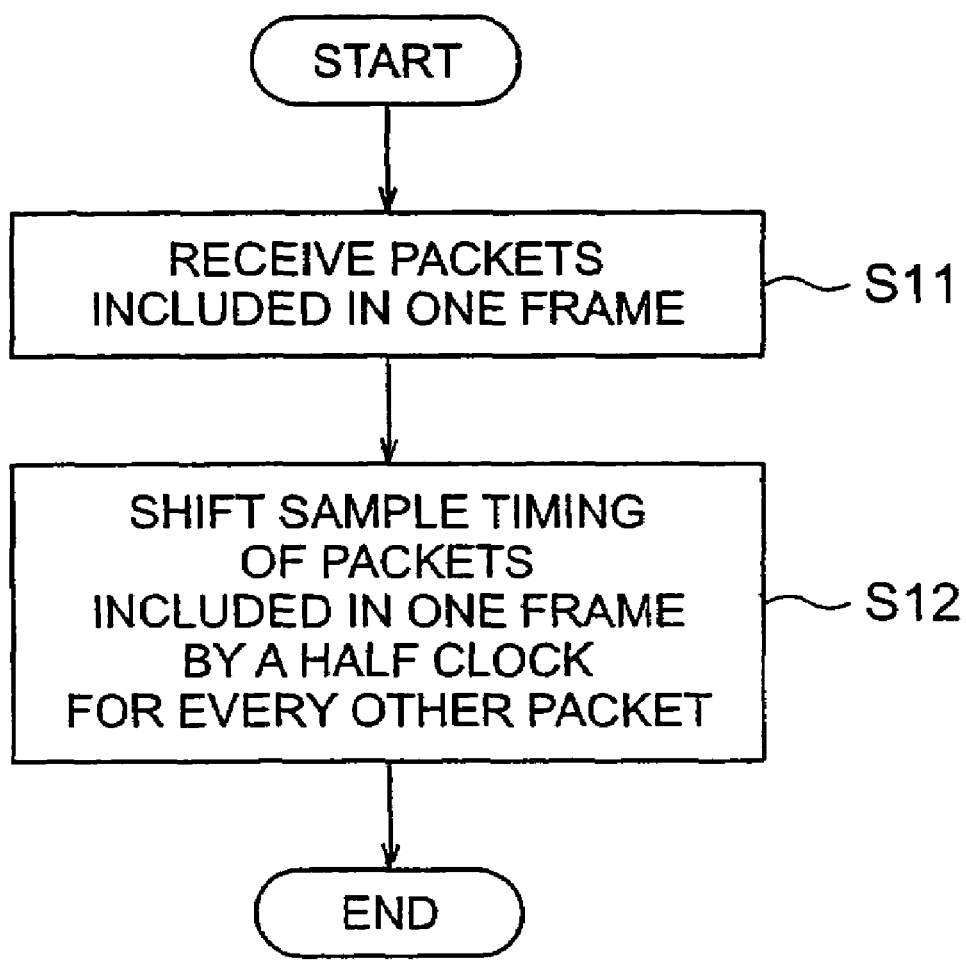
FIG. 8 is a flow chart for introduction to sample timing control process in a cellular phone of the second embodiment.
Figure 9:
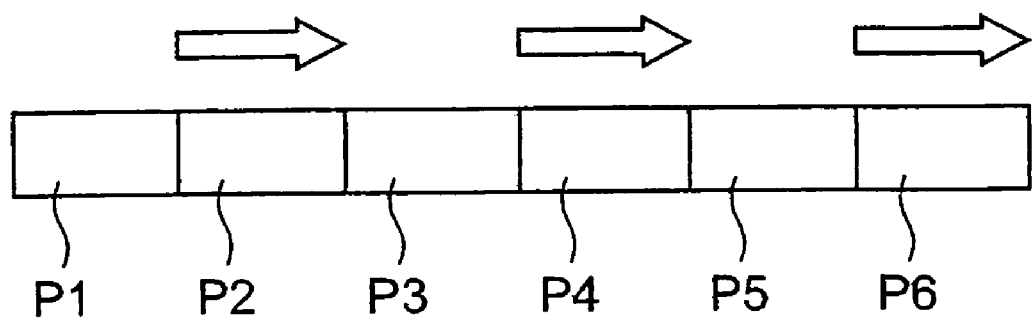
FIG. 9 is a schematic diagram for introduction to sample timing control process in a cellular phone of the second embodiment.

Next, referring to FIGS. 8 and 9, the sample timing control process in the cellular phone 1B of the second embodiment will be described.

First, the packet receiving section 10B of the cellular phone 1B receives six packets included in one frame transmitted from the base station (step S1).

Next, the sample timing control section 20B shifts the sample timing of the A/D converter in every other packet by a half clock, when sampling each packet of a plurality of packets included in one frame in turn (step S12). That is, as shown in FIG. 9, the sampling control section 20B shifts the sample timing in the three packets P2, P4, and P6 among the six packets P1 to P6 included one frame by a half clock. That is, the sample timing control section 20B shifts the sample timing in the six packets P1 to P6 included in one frame by a half clock in every other packet.

In addition, the packets the sample timing of which is shifted by a half clock are not limited to the packets P2, P4, and P6. For example, these may be the packets P1, P3, and P5. After all, the sample timing control section 20B may shift the sample timing by a half clock in the three packets which are a half of the six packets.

Thus, in the second embodiment, when error occurs in the sample timing, it is possible to reduce transmission error for three packets which are sampled by shifting the sample timing from the normal sample timing by a half clock; while when no error occurs in the sample timing, it is possible to reduce transmission error for three packets which are sampled by the normal sample timing. That is, the error in sample timing can be averaged. Thus, by averaging the error in sample timing, it is possible to reduce the transmission error without increasing sample timing, so that it is possible to improve the efficiency of the sampling in the A/D converter while suppressing the power consumption.

A Third Embodiment

Next, a third embodiment of the present invention will be described. The different point of the cellular phone in the third embodiment from the cellular phone in the first embodiment is that the sample timing for each of packets included in one frame is shifted by a half clock between the latter three packets and the former three packets in the cellular phone in the first embodiment; in contrast to this, when transmission errors are detected in equal to or more than half of packets included in one frame, the sample timing of all packets included in one frame is shifted by a half clock in the cellular phone in the third embodiment. Other points are similar to the first embodiment, so that the different point from the first embodiment will be described hereinafter.

Figure 10:
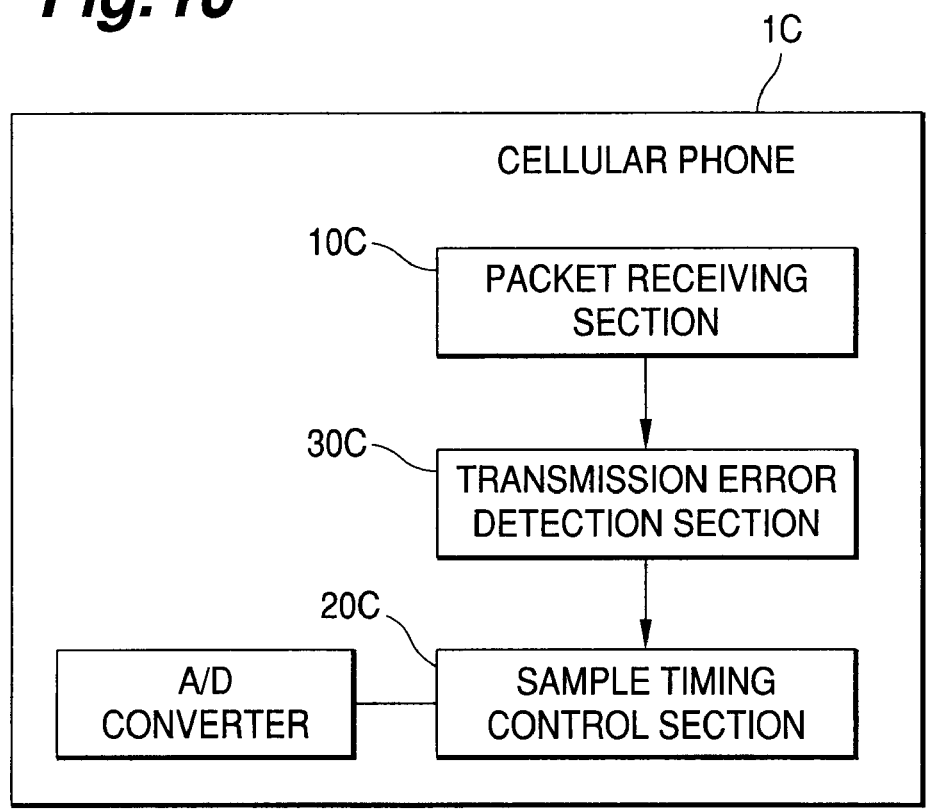
FIG. 10 is a block diagram showing functional configuration of a cellular phone in a third embodiment.

First, referring to FIG. 10, functional configuration of a cellular phone 1C in the third embodiment will be described. As shown in FIG. 10, the cellular phone 1C in the third embodiment has a packet receiving section 10C, a transmission error detection section 30C, and a sample timing control section 20C. The packet receiving section 10C is similar to the packet receiving section 10A in the first embodiment, so that its description is omitted.

The transmission error detection section 30C detects transmission error in the packets received by the packet receiving section 10C. In this embodiment, as the transmission error detection method, CRC (Cyclic Redundancy Check) is adopted. Note that the transmission error detection method may not be limited to CRC, for example, other transmission error detection method such as parity check may be adopted.

The sample timing control section 20C, when transmission errors are detected by the transmission error detection section 30C in equal to or more than a half of packets among a plurality of packets included in one frame, controls shifting of the sample timing of the A/D converter by a half clock for a plurality of packets included in this one frame.

Thus, when the transmission errors are detected in equal to or more than a half of packets, the sample timing is shifted by a half clock for all packets in one frame. The reason is that generally errors often occur in the sample timing, when transmission errors are detected in equal to or more than a half of packets. Actually, if error occurs in the sample timing, by shifting the sample timing by a half clock for all packets in one frame, it is possible to reduce transmission error in all packets, so that it is possible to highly improve the reception characteristic.

Figure 11:
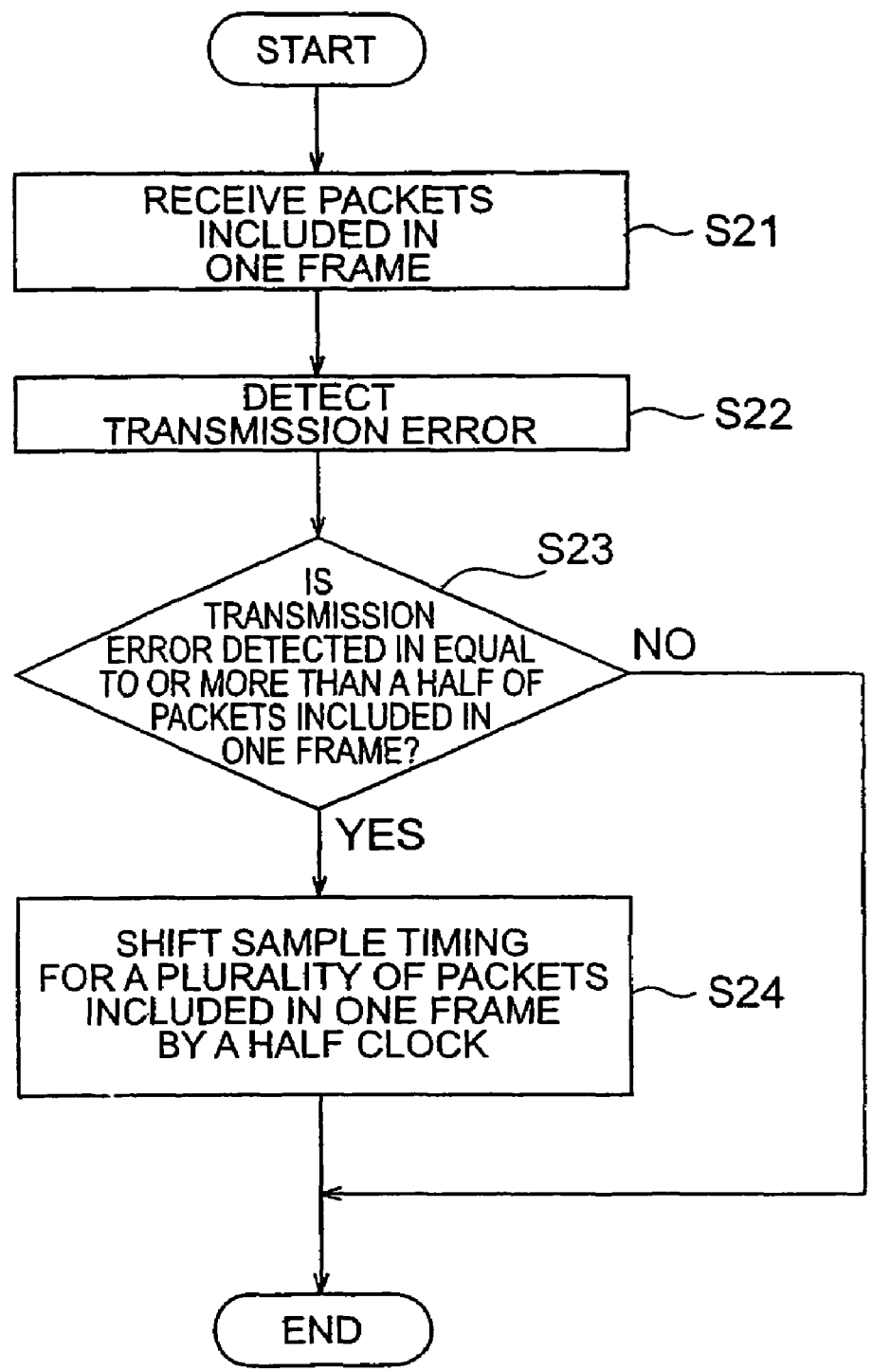
FIG. 11 a flow chart for introduction to sample timing control process in a cellular phone of the third embodiment.

Next, referring to FIG. 11, sample timing control process in the cellular phone 1C of the third embodiment will be described.

First, the packet receiving section 10C of the cellular phone 1C receives six packets included one frame transmitted from the base station (step S21).

Next, the transmission error detection section 30C detects transmission errors in the six packets received by the packet receiving section 10C in turn (step S22).

Next, the sample timing control section 20C determines whether or not the transmission errors are detected in equal to or more than a half of the six packets included in one frame (step S23). When this determination is "NO" (step S23; NO), the sample timing control process is finished.

On the other hand in step S23, the transmission errors are detected in equal to or more than a half of the packets (step S23; YES), the sample timing control process shifts the sample timing by a half clock of the A/D converter for the six packets included in this one frame (step S24).

Thus, in the third embodiment, when transmission errors are detected in equal to or more than a half of the packets included in one frame, it is possible to shift the sample timing for all packets in one frame by a half clock. Therefore, when error occurs in the sample timing and transmission errors are detected in equal to or more than a half of the packets, it is possible to reduce transmission errors in all packets in one frame, so that it is possible to highly improve reception characteristic. Due to this, it is possible to reduce transmission error without increasing the sample timing, so that it is possible to improve the efficiency of the sampling in the A/D converter while suppressing the power consumption.

A Fourth Embodiment

Next, a fourth embodiment of the present invention will be described. The different point of the cellular phone in the fourth embodiment from the cellular phone in the first embodiment is that the sample timing for each of packets included in one frame is shifted by a half clock between the former three packets and the latter three packets in the cellular phone in the first embodiment; in contrast to this, when a packet in which the retransmission request is transmitted equal to or more than three times exists, the sample timing of all packets included in one frame is shifted by a half clock in the cellular phone in the fourth embodiment. Other points are similar to the first embodiment, so that the different point from the first embodiment will be described hereinafter.

Figure 12:
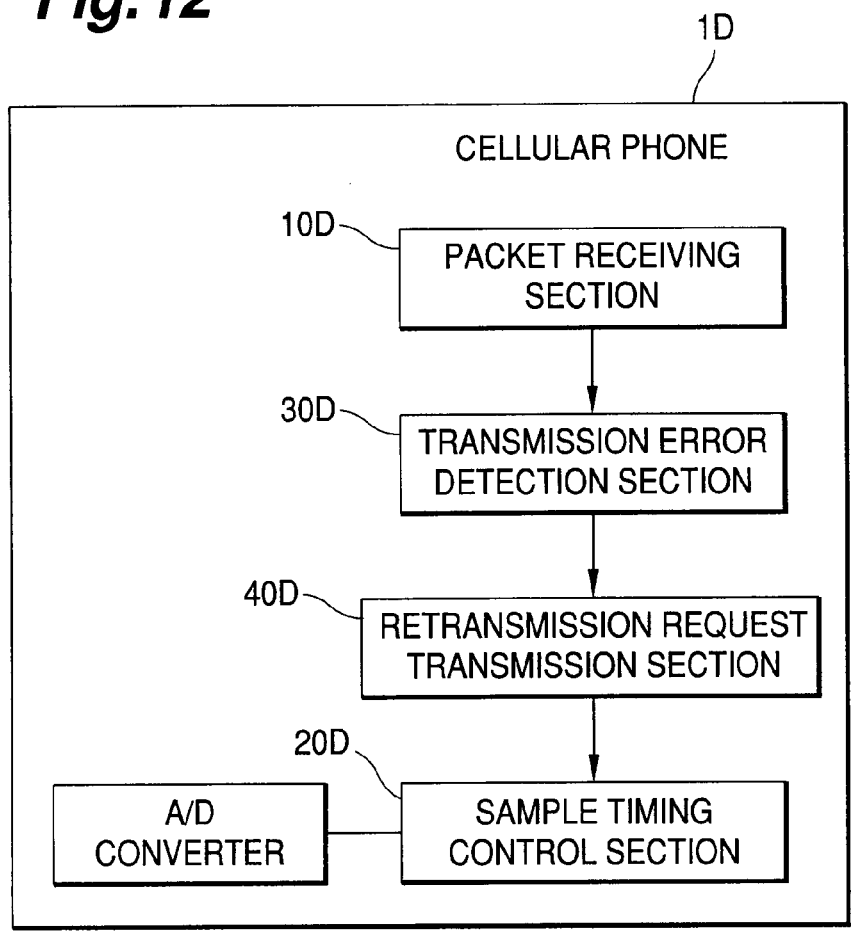
FIG. 12 is a block diagram showing functional configuration of a cellular phone in a fourth embodiment.

First, referring to FIG. 12, functional configuration of a cellular phone 1D in the fourth embodiment will be described. As shown in FIG. 12, the cellular phone 1D in the fourth embodiment has a packet receiving section 10D, a transmission error detection section 30D, a retransmission request transmission section 40D, and a sample timing control section 20D. The packet receiving section 10D and the transmission error detection section 30D have respectively similar functions to those of the packet receiving section 10A in the first embodiment and the transmission error detection section 30C in the third embodiment, so that their descriptions are omitted.

The retransmission request transmission section 40D, when transmission errors are detected by the transmission error detection section 30D, transmits the retransmission request requesting to retransmit a packet in which the transmission error is detected to the base station. Further, the retransmission request transmission section 40D counts up the number of times of the transmission of the retransmission request for each packet. The number of times of the transmission of the retransmission request counted up is stored into a memory within the cellular phone 1D. In the memory, a storage area (table) in which can be stored the number of times of the transmission of the retransmission request for each packet.

The sample timing control section 20D determines whether or not a packet which the retransmission request is transmitted equal to or more than three times exists among the packets included in one frame. The sample timing control section 20D, when determining the packet which the retransmission request is transmitted equal to or more than three times exists, controls shifting of the sample timing by a half clock in all packets included in one frame.

Thus, when the packet which the retransmission request is transmitted equal to or more than three times exists, the sample timing is shifted by a half clock for all packets in one frame. The reason is that generally error often occurs in the sample timing, when the packet the retransmission request of which is transmitted equal to or more than three times exists. Actually, if error occurs in the sample timing, by shifting the sample timing by a half clock for all packets in one frame, it is possible to reduce transmission error in all packets in one frame, so that it is possible to highly improve the reception characteristic.

Figure 13:
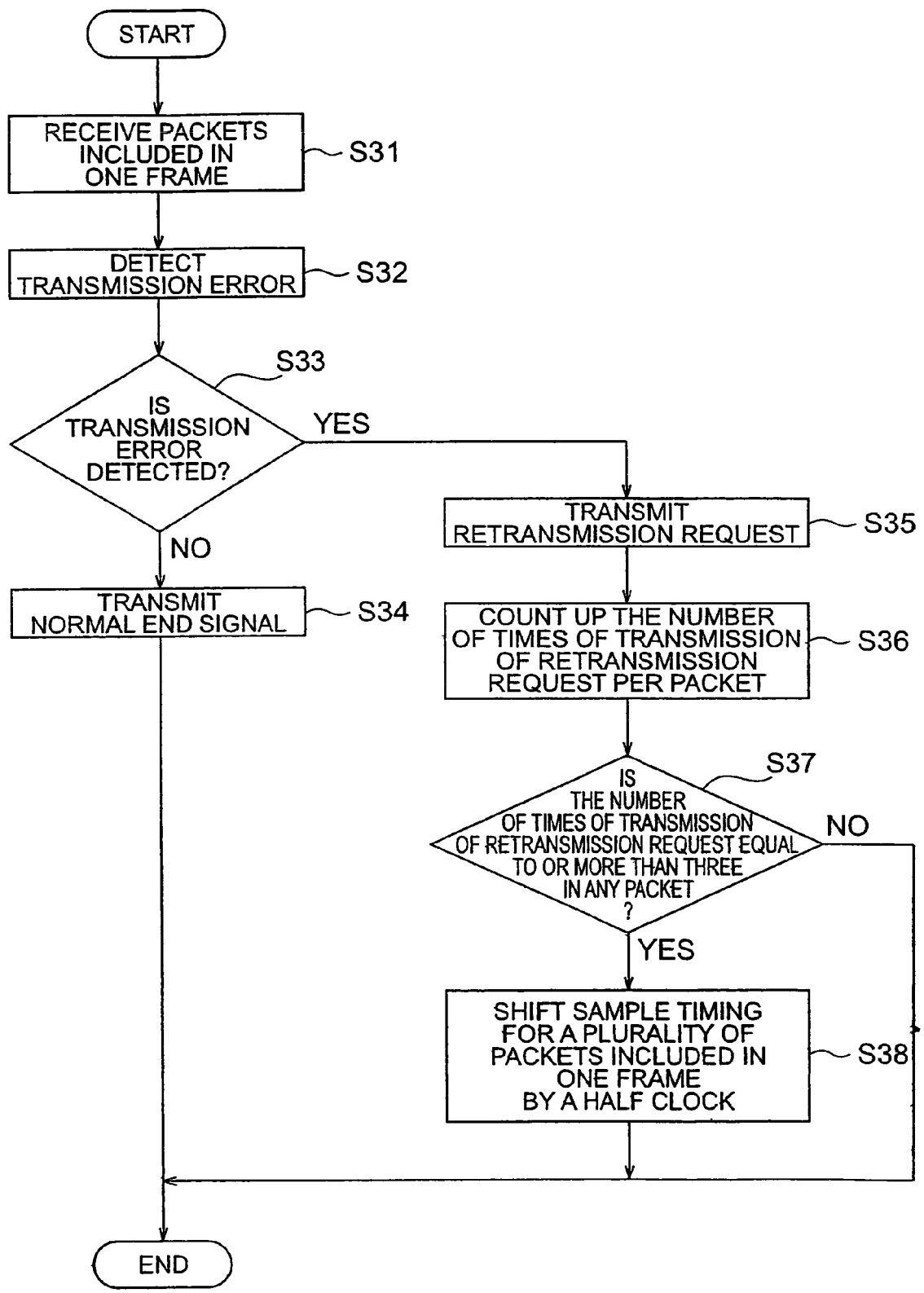
FIG. 13 is a flow chart for introduction to sample timing control process in a cellular phone of the fourth embodiment.

Next, referring to FIG. 13, the sample timing control process in the cellular phone 1D of the fourth embodiment will be described.

First, the packet receiving section 10D of the cellular phone 1D receives six packets included in one frame transmitted from the base station (step S31).

Next, the transmission error detection section 30D detects transmission error in the six packets received by the packet receiving section 10D in turn (step S32), as a result, about the packet in which no transmission error is detected (step S33; NO), a normal end signal indicating that packet reception has been normally ended is transmitted to the base station (step S34).

On the other hand, about the packet in which transmission error is detected by the transmission error detection section 30D (step S33; YES), the retransmission request requesting to retransmit the packet in which the transmission error is detected is transmitted to the base station (step S35) by the retransmission request transmission section 40D, and the number of times of the retransmission request stored in the memory within the cellular phone 1D is counted up for each packet (step S36).

Next, the sample timing control section 20D, referring to the memory, determines whether or not a packet in which the number of times of the retransmission request is equal to or more than three times exists in one frame (step S37). The cellular phone 1D, when this determination is "NO" (step S37; NO), finishes the sample control process.

On the other hand in step S37, when it is determined that the packet in which the number of times of the retransmission request is equal to or more than three times exists (step S37; YES), the sample timing of the A/D converter for the six packets included in this one frame is shifted by a half clock (step S38).

Thus, in the fourth embodiment, when the packet in which the number of times of the retransmission request is equal to or more than three times exists, it is possible to shift the sample timing for all packets of one frame by a half clock. Therefore, if error occurs in the sample timing when the packet in which the number of times of the retransmission request is equal to or more than three times exists, it is possible to reduce transmission error in all packets in one frame, so that it is possible to highly improve reception characteristic. In this way, it is possible to reduce transmission error without increasing the sample timing, so that it is possible to improve the efficiency of the sampling in the A/D converter while suppressing the power consumption.

In addition, in each embodiment described above, though the minimum communication unit is assumed to be one slot, three slots are assumed to be one packet, and six packets are assumed to be one frame, the minimum communication unit is not limited to this assumption. That is, the number of the packet included in one frame can freely be designed.

Further in addition, in each embodiment described above, though it is described by using the cellular phone as the concrete instance of the mobile communication terminal, the concrete instance of the mobile communication terminal is not limited to this, for example it may be a mobile communication terminal such as a Personal Handyphone System (PHS) or a Personal Digital Assistants (PDA) having communication function. And, a cellular phone need not necessarily have the high-speed wireless communication function. However, when having the high-speed wireless communication function in the cellular phone, unless adopting the sampling control technology in each embodiment described above, it is difficult to efficiently perform the sampling while suppressing the power consumption. The reason is that since in W-CDMA system currently commercialized, QPSK and/or low-rate coding are applied, it is almost unthinkable that error occurred in the sample timing influences the reception characteristic; while since in the HSDPA adopted for realizing high-speed wireless communication, 16QAM and/or high-rate coding are applied, error occurred in the sample timing greatly influences the reception characteristic, thereby becoming a big factor in deterioration of reception characteristic.

Further, the sample timing control section in each embodiment described above, when shifting the sample timing by a half clock, in addition to the condition in each embodiment described above, further in the case where packets are transmitted by utilizing the high-speed communication function, may shift the sample timing by a half clock It can be determined whether or not the packets are transmitted by utilizing the high-speed communication function, for example, by the data size of the packets and the modulation method of the packets. These data size of the packets and the modulation method of the packets, for example, are included in the control signal notified from the base station. Therefore, the sample timing control section first determines the data size of the packets and the modulation method based on the control signal notified from the base station, when the data size is larger than threshold value and/or when the modulation system of the packets is quadrature amplitude modulation such as 16QAM, determines that the packets are transmitted by utilizing the high-speed communication function, and may shift the sample timing by a half clock when the packets further satisfy the conditions in each embodiment described above.

What is claimed is:

1. A mobile communication terminal comprising:
   a receiving means for receiving packets; and
   a sample timing control means for controlling a sample timing of an A/D converter to convert analog signals to digital signals,
   wherein the sample timing control means shifts, out of a plurality of packets included in one frame which is a communication unit under transmission control, the sample timing of the A/D converter for half of packets by a half clock with respect to the sample timing of the A/D converter for the remaining half of the packets.

2. The mobile communication terminal according to claim 1, wherein the sample timing control means shifts, out of the plurality of packets included in the frame, the sample timing of the A/D converter for an earlier transmitted half of the packets by a half clock with respect to the sample timing of the A/D converter for a later transmitted half of the packets.

3. The mobile communication terminal according to claim 1, wherein the sample timing control means shifts the sample timing of the A/D converter for the plurality of packets included in the frame in such a manner that the sample timing is shifted by a half clock for every other packet of the plurality of packets.

4. A mobile communication terminal comprising:
   a receiving means for receiving packets;
   a transmission error detection means for detecting a transmission error in the packets received by the receiving means; and
   a sample timing control means for controlling a sample timing of an A/D converter to convert analog signals to digital signals,
   wherein when a transmission error is detected by the transmission error detection means in equal to or more than half of a plurality of packets in one frame which is a communication unit under transmission control, the sample timing control means shifts the sample timing of the A/D converter for a plurality of packets included in the one frame by a half clock.

5. A mobile communication terminal comprising:
   a receiving means for receiving packets;
   a transmission error detection means for detecting a transmission error in the packets received by the receiving means;
   a retransmission request transmission means for transmitting a retransmission request requesting a base station to retransmit a packet in which transmission error is detected by the transmission error detection means; and
   a sample timing control means for controlling a sample timing of an A/D converter to convert analog signals to digital signals, wherein the retransmission request transmission means counts for each packet a number of times that a retransmission request has been transmitted, and the sample timing control means, when a packet exists in which the number of times of the retransmission request counted is equal to or more than three among a plurality of packets in one frame which is a communication unit under transmission control, shifts the sample timing of the A/D converter for a plurality of packets included in the one frame by a half clock.

6. The mobile communication terminal according to claim 1, wherein the sample timing controlling means shifts the sample timing of the A/D converter by a half clock by shifting the sample timing from a leading edge of a pulse of a clock signal to a trailing edge of the pulse of the clock signal.

7. A mobile communication terminal comprising:
a receiving unit configured to receive packets; and
a sample timing control unit configured to control sample timing of an A/D converter to convert analog signals to digital signals,
wherein the sample timing control unit shifts, out of a plurality of packets included in one frame which is a communication unit under transmission control, the sample timing of the A/D converter for a half of packets by a half clock with respect to the sample timing of the A/D converter for the remaining half of packets.

* * * * *